DIGITAL AUTOMATIC FREQUENCY CONTROL SYSTEM

Filed July 11, 1966 2 Sheets-Sheet 1

INVENTOR.
JAMES R. ZOERNER
BY Alden D. Redfield
Charles M. Hogan
ATTORNEYS.

Feb. 20, 1968 J. R. ZOERNER 3,370,252

DIGITAL AUTOMATIC FREQUENCY CONTROL SYSTEM

Filed July 11, 1966 2 Sheets-Sheet 2

INVENTOR.
JAMES R. ZOERNER
BY Alden D. Redfield
Charles M. Hogan
ATTORNEYS.

United States Patent Office 3,370,252

Patented Feb. 20, 1968

3,370,252

DIGITAL AUTOMATIC FREQUENCY CONTROL SYSTEM

James R. Zoerner, Cincinnati, Ohio, assignor to Avco Corporation, Cincinnati, Ohio, a corporation of Delaware Filed July 11, 1966, Ser. No. 564,347
4 Claims. (Cl. 331—18)

ABSTRACT OF THE DISCLOSURE

A voltage controlled oscillator is controlled by an integrator. At the initiation of a cycle of operation a time gate is set up and a counter begins to count the oscillator output pulses in an approach to a pre-set number or count. A two-level reference pulse is also initiated. Ideally, the count is satisfied, that is the oscillator reaches the pre-set count, at the instant of the transition in the reference pulse. When the oscillator is fast, a first coincidence device or "and" gate, to which the reference pulse and the output of a first flip flop, set by a count satisfied indication, are applied, measures the width of the high level portion of the reference wave which remains after reception of the count satisfied pulse and before the transition. The first coincidence device is disabled by the transition. When the oscillator is slow, a second coincidence device or "and" gate, to which the inverted reference pulse and the output of a second flip flop, set by the reference wave form, are applied, measures the width of the high level portion of the inverted reference wave which follows the transition and precedes the arrival of the count satisfied pulse. An additional output from the first flip flop is used to disable the second coincidence gate when the count satisfied pulse arrives. The pulse output of the first gate is applied to the integrator to slow down the oscillator and the inverted pulse output of the second coincidence gate is applied to the integrator to speed up the oscillator. The initiation of the reference wave form also sets up the time gate.

The present invention relates to stable frequency signal generators, and particularly to a novel digital system in which an oscillator is brought under control by control pulses of which the width and polarity depend on the direction and degree of error between controlled and reference wave forms.

In many applications, particularly in communications, it is necessary to provide a variable frequency oscillator which has the capability of generating many closely spaced, highly stabilized frequencies.

The system provided by the present invention provides means for setting up a time gate during which the output frequency of a controlled oscillator is permitted to reach a preset value. Ideally, the attainment of this preset value occurs at the transition point in a two-level reference wave form.

Any frequency error is digitally detected in the form of a pulse having a width and polarity functionally related to the degree and direction of such error. If a control pulse is of one polarity it emerges from one of two gates and if the control pulse is of the opposite polarity it emerges from the other gate.

An object of the invention is to provide a large number of very stable controlled frequencies from a single frequency standard.

Another principal object of the invention is to provide means for stabilizing an oscillator at any one of a large number of predetermined frequencies.

The principal object of the invention is to provide a particularly simple digital frequency control system that has a minimum number of components and is reliable in operation.

Various arrangements for stabilizing a plurality of oscillator frequencies are known to the art. See, for example, United States patent to Young 2,490,500, issued Dec. 6, 1949, and also United States patent application, Ser. No. 149,399, Brauer, filed in the United States Patent Office on Nov. 1, 1961 and assigned to the same assignee as the present application and invention, now U.S. Patent No. 3,259,851, issued July 5, 1966.

In Brauer pulses representative of lead or lag are digitally counted and utilized for control purposes. In the Young circuitry wave forms representative of the time required for a predetermined count are set up and control pulses representative of the time differential between these wave forms and reference wave forms are derived. In the case in which the oscillator is too fast the control pulses of Young are effectively slices of the reference wave forms. However, in the case in which the oscillator is slow the control pulses are effectively portions of the wave forms which represent the time required to perform the count. This time varies and therefore said wave forms vary. Now the reference wave forms constitute a fixed framework and an object of the present invention is to provide an improvement over the Young type of system in which, whether the oscillator is fast or slow, the control pulses effectively represent portions of the reference wave forms.

In accordance with the present invention the slicing of the reference wave form is initiated or concluded at the time when the "count satisfied" or signal pulses occur. While the invention is concerned with the time of occurrence of a given counter output, i.e., comparison satisfied pulse, it is indifferent as to the time period which elapses between such pulses. The improvement over both Young and Brauer resides in the fact that in accordance with the present invention a two-level reference wave form always is effectively sliced to produce control pulses. The novel system is accordingly controlled from a fixed framework of reference.

Among the advantages of the present invention is the ease with which large errors are detected and fast synchronization accomplished.

For a better understanding of the invention, together with other and further objects, advantages and capabilities thereof, reference is made to the following description of the appended drawings in which.

Figure 1:
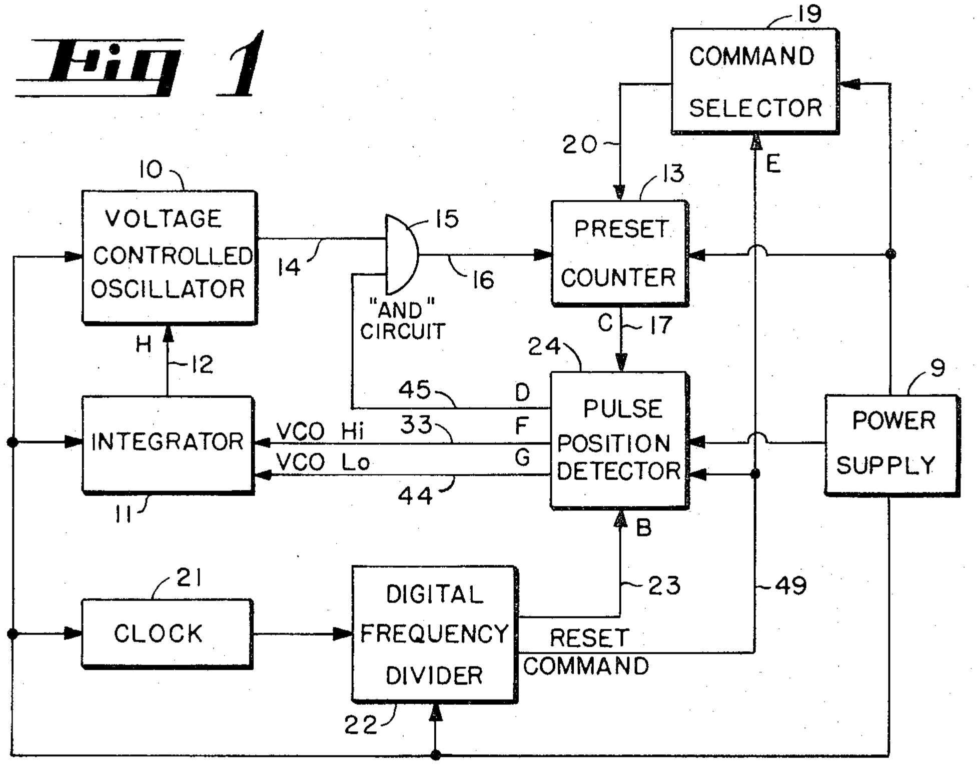
FIG. 1 is a circuit schematic of a complete stable frequency signal generating system in accordance with the present invention, having the capacity to generate an extremely large number of stable frequencies.

Now, making reference to FIG. 1, the apparatus here provided includes a conventional oscillator 10. The invention functions to derive from this oscillator a large number of stable frequencies. The oscillator is programmed or tuned in discrete steps by means not shown herein in detail. Various arrangements for performing this programming function being well known to those of skill in the art, the following discussion of the invention will confine itself to the details as to how the oscillator is stabilized at a partcular frequency. For frequency control purposes a direct current control input line 12 is coupled from the output of an integrator 11 into the input of oscillator 10.

At the time that the oscillator is programmed, i.e., set to its desired frequency, a number, which is small relative to the desired system frequency, is also set into a preset counter 13 by command selector 19. This unit 13 comprises a register, in which any one of a large number of desired numbers may be set. The unit 13 also contains a counter, which digitally counts from the number which is set into the counter to the full capacity of the counter. A portion of the output of oscillaor 10 is applied to the counter via line 14, "and" gate 15, and the line 16. The gate 15 is placed in signal-passing condition by gate pulses to provide for periodic counts. Assuming the number 1,000 is set into the preset counter and assuming further that the gate 15 is in such condition, then the counter in unit 13 will begin to count output pulses of the oscillator 10 and will count same until the counter it at full capacity, i.e., the maximum number of 9,999 attained, whereupon a signal pulse will appear on output line 17 of the counter. The quantity of pulses to obtain this maximum in this example is 9,999 minus the preset 1,000 or 8,999.

Figure 3:
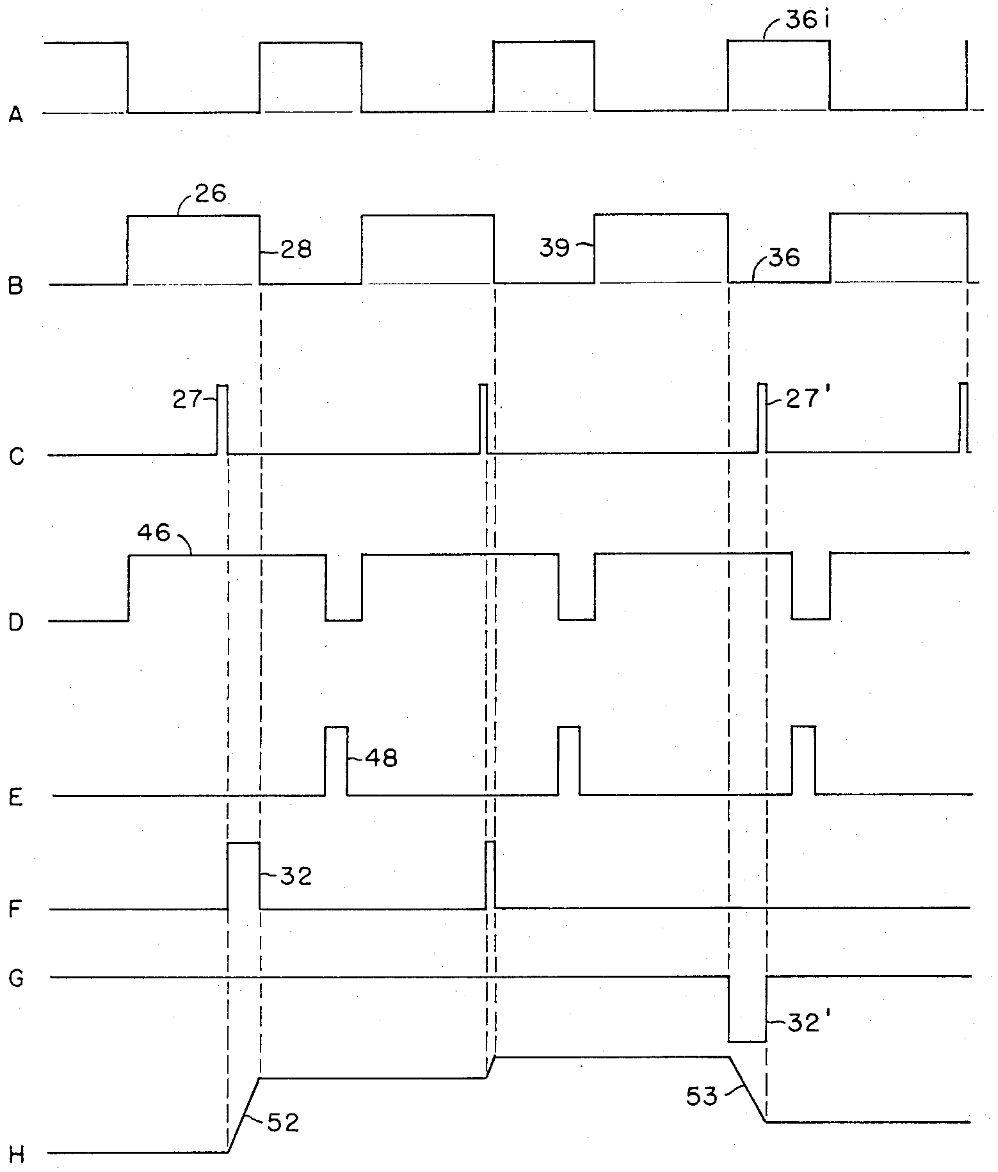
FIG. 3 is a set of curves useful in explaining the operation of the frequency control system of FIG. 2.

Such a signal pulse is shown at 27 on Curve C of FIG. 3 and, as will be seen, this signal pulse or "count satisfied" pulse is itself essentially a controlled pulse, because the time of its occurrence, with respect to a reference pulse, depends on the extent to which the output of the oscillator may be advanced or retarded or accurate in frequency. If the oscillator is too fast the signal (27, Curve C) will appear on line 17 before a certain transition (hereinafter described) in a reference pulse. If the oscillator is going too slow then the signal (27', Curve C) will appear on line 17 after such transition occurs.

Now this process, i.e., counting from a preset number to full capacity and using the indication of the full count as a signal pulse, is a repetitive process and the counting circuits in the preset counter 13 are accordingly automatically set to a preset count by the command selector device 19 via line 20. When the system frequency is high the count stored in the preset counter is small. When the system frequency is low, the count stored in the preset counter is large. Any desired digital number may be set in the preset counter, and therefore, system-wise, the voltage controlled oscillator may be stabilized at any one of a large number of frequencies.

No matter what the frequency of the system may be, the frequency controlled elements of the system are controlled by a stable clock 21 and its output is divided in frequency by a digital frequency divider 22 which produces at its output a train of reference wave forms having alternate high and low levels, as illustrated in Curve B of FIG. 3. These wave forms appear on output line 23.

Parenthetically, a power supply 9 has suitable supply lines to the command selector, preset counter, pulse position detector, digital frequency divider, stable clock, integrator and controlled oscillator.

The pulse position detector unit is designated 24 in FIG. 1 and it has outputs 33, 44 and 45. Unit 24 comprises the elements shown in FIG. 2. The output 33 is used to apply to the integrator 11 control pulses of one polarity (32, Curve F) to slow down the controlled oscillator and the output 44 is used to apply to the integrator output pulses of the opposite polarity (32', Curve G) to speed up the controlled oscillator. The gate pulses on output line 45 are applied to gate 15 in order to permit the flow of pulses from the controlled oscillator to the counter 13 as the counting process occurs. This gate 15 boils down to an arrangement for fixing successive predetermined times during which the maximum count is satisfied. These gate pulses are shown at 46 in Curve D of FIG. 3.

Figure 2:
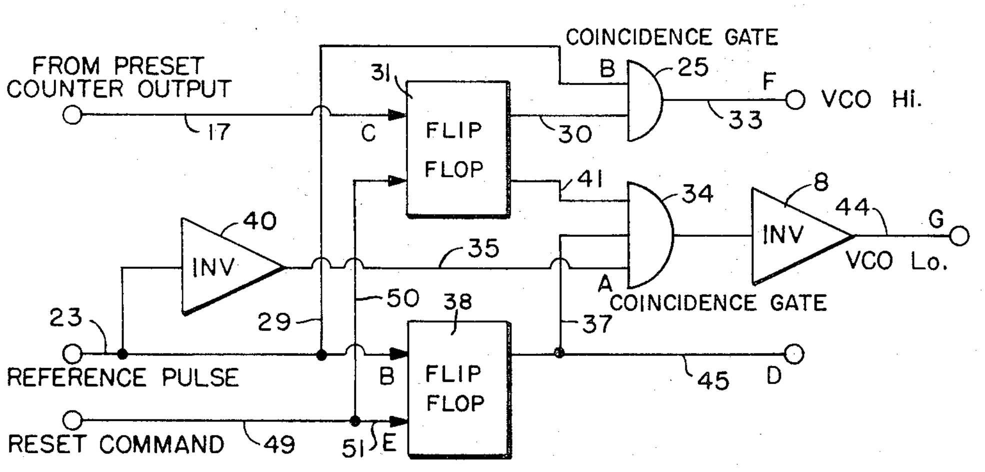
FIG. 2 is a circuit schematic, generally in block form, of the frequency control system in accordance with the invention.

Making reference to FIG. 2, the "and" gate 25 effectively performs the function of measuring the duration of that portion of the high level part 26 (Curve B, FIG. 3) of the reference wave form which remains after the occurrence of the signal pulse 27 (Curve C). When the controlled oscillator is fast then the signal pulse 27 precedes the high-low transition 28 of the reference wave form. In other words, the gate 25 is a coincidence device which measures the time interval between the signal pulse 27 and the high-low transition 28 and the gate 25 accordingly operates in the manner now described.

The gate 25 has an input line 29 which is coupled to the reference wave form source so that such input is in a "1" condition whenever the high level portion of the reference wave form is present. Another input of that gate is connected to the output 30 of flip flop 31 and is in a "1" condition when the flip flop 31 is set by the signal pulse 27. When both inputs to gate 25 are "1's" the gate 25 provides a "1" output of duration equal to that portion of the high level portion of the reference wave form which succeeds the signal pulse. When the high-low transition 28 occurs, then the gate 25 is closed because input 29 is then in a zero condition.

Therefore it will be seen that the gate 25, in a sense, passes a time slice 32 (Curve F, FIG. 3) of the high level portion 26 of the reference wave form when two "1" inputs are applied to that gate, i.e., the high level portion of the reference pulse and the set condition of flip flop 31 occasioned by the signal input. The gate 25 measures the time differential between the signal-pulse-occurrence event and the end-of-high-level-of-reference-wave-form event.

When gate 25 operates, pulse 32, a function of that time differential (Curve F, FIG. 3), accordingly appears on line 33, the output of gate 25.

Now let there be considered the events which occur when the controlled oscillator is slow.

The "and" gate or coincidence device 34 then effectively performs the function of measuring the duration of that portion of the inverted low level part of the reference wave form which precedes the occurrence of the signal pulse. When the controlled oscillator is slow then the signal pulse 27' (Curve C, FIG. 3) will follow the high-low transition of the original reference wave form (Curve B). The significant events are now transposed in time. In other words, the gate 34 measures the time differential between the high-low transition and the signal pulse 27' and the gate 34 accordingly operates in the manner now described.

The gate 34 has an input 35 which is coupled through an inverter 40 to the reference pulse source so that such input is in a "1" condition whenever the low level portion 36 (FIG. 3, Curve B) of the reference wave form (ie., high level portion **36*i* of the inverted wave form, Curve A) is occurring. Another input 37 of that gate is connected to the output of flip flop 38 and is in a "1" condition when the flip flop 38 is set by the low-high transition 39** (Curve B) of the reference wave form.

The gate 34 is now in possession of information which tells it when to begin effectively slicing and what to slice, i.e., the inverted low level portion (**36*i*, Curve A) of the reference wave form. Under the facts supposed the third input 41 of the gate is in a "1" condition because the signal 27' has not yet been received. When the signal 27' is received the gate 34 is disabled by the set of flip flop 31. This flip flop has a second output 41 which at this time applies a "0" input to gate 34. Gate 34 produces a pulse which is inverted at device 8 to the form 32' (Curve G) and appears on line 44**.

In the case when the signal is fast the gate 25 is turned off because of the high-low transition 28 of the reference wave form. On the other hand, in the case where the signal is slow, since the low level portion 36 of the reference wave form (or high level portion **36*i* as inverted) continues after the generation of the signal pulse, then the flip flop 31 is used to disable gate 34. That is, the signal 27' puts flip flop 31 in that condition which disables gate 34. Thus it will be seen that the signal, acting on flip flop 31, enables gate 25 and disables gate 34. The reference wave form, acting on flip flop 38, enables gate 34. The reference wave form applied to gate 25 directly and to gate 34 in inverted form can pass through gate 25 (if enabled) during the high level portion of the reference wave form and gate 34** (if enabled) during the low-level portion of the reference wave form.

When the controlled oscillator is in synchronism both flip flops 31 and 38 are set but the "0" output on line 41, closing gate 34, occurs at the same time as the end of the "1" output on line 29, so that gate 25 remains closed.

Referring now to the curves in FIG. 3, Curve A shows the inverted reference wave form as applied at input 35 of gate 34. Curve B is the reference wave form as applied at input 29 of gate 25. Curve C shows the signal. The first pulse in Curve C is pulse 27 showing the conditions which exist when the oscillator is fast. The second pulse shows the signal pulse when the oscillator is not so fast, and the third pulse 27' is the signal pulse when the oscillator is slow. Referring now to Curve D, it shows the time gating wave form 46 which appears on line 45 in order to open gate 15. This gating wave form is produced by the flip flop 38 when it is set by the reference pulse 26. The wave form 46 establishes the time during which the counting process takes place in counter 13. The wave form 46 is terminated by a reset command (Curve E, FIG. 3). Each reset command pulse such as 48 is communicated to the command selector to preset its counter back to the binary number which is representative of the desired frequency via line 49. It is also communicated, via reset inputs 50 and 51, respectively, to flip flops 31 and 38 in order to reset them. Curve F shows control pulses of positive polarity and Curve G shows a control pulse of negative polarity. Curve H shows the level of the voltage output of the integrator 11. This voltage output is increased as indicated at 52 by positive control pulses such as 32 and it is decreased as indicated at 53 by negative control pulses such as 32'.

Since the reference pulse is applied to the input of flip flop 38 and the gate wave form appears at the output of flip flop 38 the gate pulse is initiated at the same time as the high level of the reference wave form and its continues until flip flop 38 is reset. Now the reset command pulse (Curve E) 48 originates at the same frequency divider 22 that originates the reference pulses, so that a reset command pulse occurs immediately in advance of each reference pulse.

While there has been shown and described what is at present considered to be the preferred form of the invention, it will be understood by those skilled in the art that various changes and modifications may be made therein without departing from the scope of the invention as defined by the appended claims.

I claim:

1. The combination of:
a frequency-controlled oscillator,
a source of two-level reference wave forms having high-low transitions,
signal means for periodically producing pulse signals functionally related to the actual frequency of said oscillator, said signal means comprising a counter device which is adapted to count the oscillations generated by the oscillator and to furnish a pulse signal whenever a predetermined count is attained,
means including a first coincidence device for slicing those portions of the reference wave forms ahead of said transitions to produce control pulses of one polarity having a width dependent on the lead between said pulse signals and said transitions,
means including a second coincidence device for slicing those portions of the reference wave forms following said transitions to produce control pulses of the opposite polarity having a width dependent on the lag between said pulse signals and said transitions, and
means for utilizing said control pulses to control said oscillator.

2. The combination of:
a frequency controlled oscillator,
a source of reference wave forms having high amplitude portions and low amplitude portions and high-low transitions,
signal means for periodically producing pulse signals functionally related to the actual frequency of said oscillator,
said signal means comprising a counter device which is adapted to count the oscillations generated by the oscillator and to furnish a pulse signal whenever a predetermined pre-set count is attained,
first means including a first coincidence device for slicing any high amplitude portions of the reference wave forms following said pulse signals and ahead of said transitions to produce control pulses of one polarity having a width dependent on the lead between said pulse signals and said transitions,
said first slicing means comprising
a first binary device having an input coupled to the counter device and also two outputs,
the first coincidence device being an "and" gate having one input connected to one of the two outputs of the first binary device and another input coupled to the source of reference wave forms,
an inverter,
second means including a second coincidence device for slicing any high amplitude portions of the reference wave forms as inverted following said tranitions and ahead of the pulse signals to produce control pulses of the opposite polarity having a width dependent on the lag between said transitions and said pulse signals,
the second slicing means comprising
a second binary device having an input coupled to the source of reference wave forms and also one output,
the second coincidence device being an "and" gate having one input coupled to the last-mentioned output and another input coupled by said inverter to the source of reference wave forms and an inhibiting input coupled to the remaining output of said first binary device, and
means for utilizing said control pulses to control said oscillator.

3. The combination of:
a frequency controlled oscillator,
a source of two-level reference wave forms having high amplitude portions and low amplitude portions and ligh-low tranitions,
signal means for periodically producing pulse signals functionally related to the actual frequency of said oscillator,
said signal means comprising a counter device which is adapted to count the oscillations generated by the oscillator and to furnish a pulse signal whenever a predtermined pre-set count is attained,
first means including a first coincidence device for slicing any high amplitude portions of the reference wave forms following said pulse signals and ahead of said transitions to produce control pulses of one polarity having a width dependent on the lead between said pulse signals and said transitions,
said first slicing means comprising
a first binary device having an input coupled to the counter device and also two outputs,
the first coincidence device being an "and" gate having one input connected to one of the two outputs of the first binary device and another input coupled to the source of reference wave forms,
an inverter,
second means including a second coincidence device for slicing any high amplitude portions of the reference wave forms as inverted following said transitions and ahead of the pulse signals to produce control pulse of the opposite polarity having a width dependent on the lag between said transitions and said pulse signals, the second slicing means comprising a second binary device having an input coupled to the source of reference wave forms and also one output, the second coincidence device being an "and" gate having one input coupled to the last-mentioned output and another input coupled by said inverter to the source of reference wave forms and an inhibiting input coupled to the remaining output of said first binary device, means for utilizing said control pulses to control said oscillator, the second binary device being adapted to produce time gate pulses, and gating means between said controlled oscillator and said counter and adapted to be enabled by said time gate pulses to provide gating intervals.

4. The combination in accordance with claim 3 and means for resetting said binary devices and said counter at the end of each gating interval.

References Cited

UNITED STATES PATENTS

| | | | |
|---|---|---|---|
| 3,165,706 | 1/1965 | Sarratt | 331—18 |
| 3,185,938 | 5/1965 | Pelosi | 331—25 X |
| 3,249,886 | 5/1966 | Anderson et al. | 331—18 X |

ROY LAKE, *Primary Examiner.*

S. H. GRIMM, *Assistant Examiner.*